United States Patent [19]

Tobuse et al.

[11] Patent Number: 5,005,138

[45] Date of Patent: Apr. 2, 1991

[54] ELECTRON BEAM DIRECT PRINTING APPARATUS

[75] Inventors: Hiroaki Tobuse; Hidenobu Murakami; Masashi Kamio, all of Amagasaki, Japan

[73] Assignee: Mitsubishi Denki Kabushiki Kaisha, Tokyo, Japan

[21] Appl. No.: 511,788

[22] Filed: Apr. 20, 1990

[30] Foreign Application Priority Data

Apr. 20, 1989 [JP] Japan ................................. 1-102212

[51] Int. Cl.⁵ .......................................... G01N 21/00
[52] U.S. Cl. ................................. 364/519; 346/158; 250/492.2
[58] Field of Search ........... 346/159, 161, 158; 364/518–520, 917.96 MS File, 930.7 MS File; 250/492.1, 492.2, 492.3, 427; 315/111.81

[56] References Cited

U.S. PATENT DOCUMENTS 3,810,165  5/1974  Rosenthal .................... 340/324 A
3,815,094  6/1974  Smith ................................ 346/161

FOREIGN PATENT DOCUMENTS

54-56769  5/1979  Japan ................................. 364/519
62-154729 7/1987  Japan ................................. 364/519
64-31418  2/1989  Japan ................................. 364/519

Primary Examiner—Arthur G. Evans

[57] ABSTRACT

Printing pattern information from a printing pattern CAD is converted and output as deflection scanning data for the X-axis and the Y-axis by a deflection scanning data generating means. An electron beam deflection scanning means executes deflection scanning by an electron beam on a circuit printing base on the basis of the output deflection scanning data. The printing pattern irradiated with the electron beam is input to a bit map memory by dots which correspond to the points which are irradiated with the electron beam. A radiation control means can ascertain whether or not the point which is to be irradiated with the electron beam has already been subjected to beam irradiation at real time by consecutively reading out the dot information in the bit map memory at the address corresponding to the deflection scanning data. If there is no dot, a dot is written in the bit map memory simultaneously with beam irradiation, while if there is a dot, a blanking means outputs a control signal for cutting off the electron beam. Thus, overlap in printing pattern is detected at real time, thereby ensuring the avoidance of multiple beam radiation, namely, multiple exposure.

14 Claims, 8 Drawing Sheets

ELECTRON BEAM DIRECT PRINTING APPARATUS

BACKGROUND OF THE INVENTION

1. Field of the Invention

The present invention relates to an electron beam printing apparatus which is capable of high-quality pattern exposure free from multiple exposure when printing a fine pattern on a circuit printing base.

2. Description of the Related Art

Avoidance of multiple exposure is essential for printing a fine pattern on a mask or a wafer with accuracy by scanning an electron beam in the field of the production of a semiconductor.

In designing a mask pattern, a building block system is generally adopted in order to facilitate the design. This is a method of constructing a layout by combining various blocks which are defined in advance. The final layout drawing which is a combination of separate layers is therefore a combination of about 2 to 4 rectangles or polygonals in most cases.

If the patterns of the layout drawing are exposed to an electron beam one by one, multiple exposure is produced in a considerable number of regions. As a result, a non-uniformity of amount of radiation is produced, in other words, the portions of over-exposure are produced in the same drawing, thereby greatly deviating the actual pattern dimension from the dimension in the design.

Especially, when a strict pattern accuracy is required, multiple exposure is the problem to be eliminated.

Such multiple exposure is also the problem in printing a pattern on a circuit printing base with a photoresist applied thereto by scanning an electron beam as in wafer exposure.

To explain this, the way a printing pattern CAD outputs a printing pattern will first be described.

The most general system for exposing a pattern on a circuit printing base is, at present, a film exposing system using ultraviolet rays. In this system, the draft is often drawn on art work film by a drafting machine called a photo plotter or laser plotter. When a printing pattern data output from the printing pattern CAD is inputted to the drafting machine, the data is converted into data of a format which is suitable for drafting, thereby executing drafting on the film. A format called Gerber format is now predominant as the format of printing pattern data outputted from the printing pattern CAD and inputted to the drafting machine. This format fundamentally consists of the aperture size which corresponds to the pattern width, the coordinates of the starting point (Xs, Ys) and the end point (Xe, Ye) of each segment of the printing pattern, and a series codes for indicating whether or not the respective segments are to be exposed.

Figures 8A, 8B:
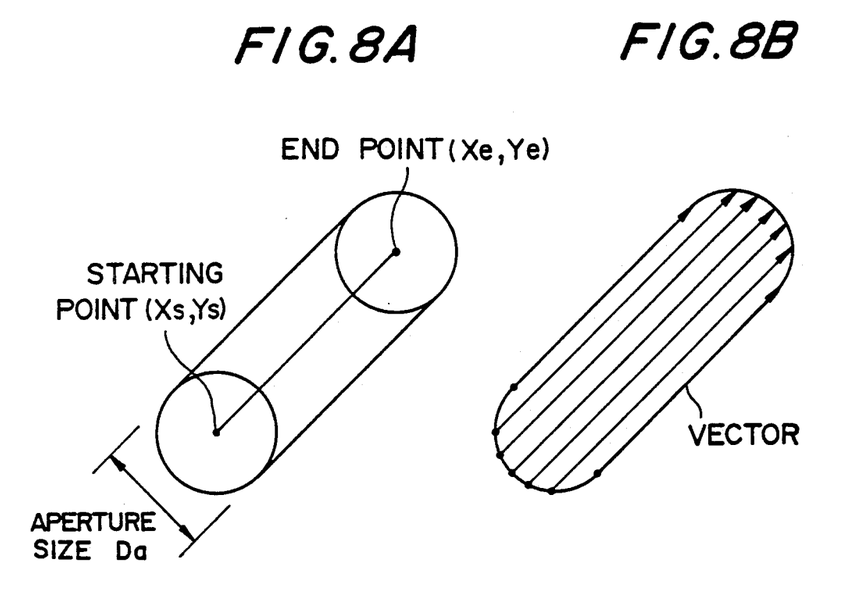
FIGS. 8A–8C explains the state in which multiple exposure is produced which matters in printing a pattern on a base.

FIG. 8(A) shows a pattern of one segment represented by data in a Gerber format. The trajectory of a circle having a diameter of Da, which is the designated aperture size Da corresponding to the pattern width, and having linearly moved from the starting point (Xs, Ys) to the end point (Xe, Ye) is represented by a pattern segment.

FIG. 8(B) shows the state in which a pattern for one segment is scanned by an electron beam. In the case of scanning by an electron beam, the pattern having a line width exceeding the diameter of the beam spot is scanned as an aggregate of a plurality of vectors parallel to the center line of the pattern. This is concept of printing is called a vector scanning system.

Figure 8C:
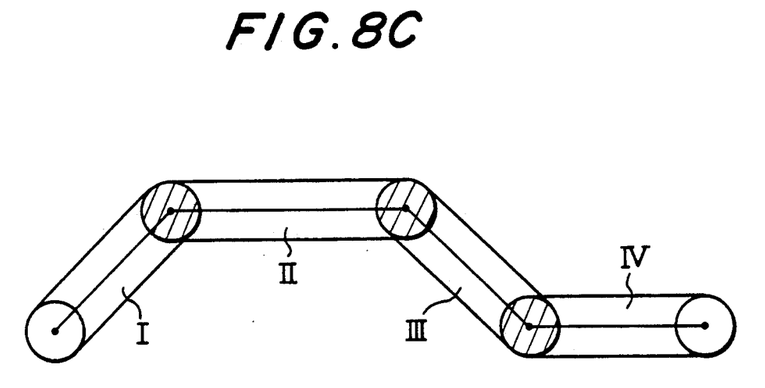

FIG. 8(C) shows an example of a pattern of winding obtained by connecting patterns of segments. If a pattern for one segment is faithfully drawn by vector scanning as shown in FIG. 8(B), double exposure is produced in the areas represented by the hatches in FIG. 8(C).

Such multiple exposure does not matter in the case of printing by raster scanning. In the raster scanning system, only the portions to be exposed are successively irradiated for printing by horizontal scanning as in the case of television scanning. In the case of printing by raster scanning, the bit map image of the patterns is generally formed in the memory. The bit map image is a binary graphic produced by resolving the printing pattern into dots for the respective bits which correspond to the beam spot, and classifying into the pattern portions as bit [1] and the other portions as bit [0]. This information is written into the memory. At the time of printing, the dot data are successively read out of the memory and the beam is radiated to the portions having bit [1] and not radiated to the portions having bit [0]. Consequently, even if there are portions which are apparently subjected to multiple exposure in the design, no multiple exposure is produced in the actual work.

In the case of printing by raster scanning, however, deflection scanning on the entire surface is required irrespective of the ratio of the areas under pattern occupation in the base.

In contrast, in the case of printing by vector scanning, since only the pattern portions are scanned, the effective printing time is naturally shortened. The ratio of the areas under pattern occupation in ordinary circuit printing base is as small as 20 to 30%, so that the effect on the reduction in the effective printing time is large.

Development of technique for securing the pattern accuracy in the printing by vector scanning while avoiding multiple exposure is therefore important from the point of view of throughput.

Some of the conventional electron beam exposure apparatii for exposing a wafer by using a mask are provided with a function of detecting a portion subjected to multiple exposure, as disclosed in, for example, Japanese Patent Laid-Open No. 56769/1979. The contents are summarized as follows:

In designing a mask pattern used for exposure of a wafer, various blocks defined in advance are combined for constructing a layout The final layout drawing is a combination of rectangles or polygonals. Rectangular areas which are in contact with the vertices of the respective rectangles or polygonals and contain the respective figures are set. If the rectangular areas of two figures do not overlap with each other, these two figures are regarded as including no overlapping portion and printed as they are. On the other hand, if they overlap with each other, whether or not there is an overlapping portion as oblique figures is examined in a rotating coordinate system. In this way, since the electron beam exposure apparatus is provided with a function of automatically detecting the overlap of patterns, the processing for eliminating overlap is greatly reduced.

The above-described related art pertains to a system for detecting overlap between figures, but a method for avoiding overlap, if any, is not concretely described.

In the case of directly printing a circuit on a base by vector scanning, operation for examining at what position and to what extent one pattern overlaps with another is also necessary.

This operation is not easy. For example, it may seem that the existence of an overlap at the connecting point of the pattern segments (I) and (II) is easily found in FIG. 8(C), but it is actually difficult because there is no graphic continuity in the arrangement of the pattern data.

To state this more concretely, if the Gerber data were arranged in the right order such as the order of the patterns (I), (II), (III) . . . , the relationship of the connection between the patterns would be comparatively easily examined. In most of the actual operations, however, they are not arranged in the right order. For example, the horizontal patterns (II, IV) are first designated, the vertical patterns are next designated and the oblique patterns (I, III) are finally designated. In order to examine the relationship of connection between the pattern segments, it is therefore necessary to first read the Gerber data on all pattern segments on the entire surface and to retrieve the pattern segment which is connected to the pattern segment (I). Similar operations are required in the other pattern segments. Such operations are generally executed in by software in a computer, and the higher the density the pattern has, the larger the amount of time is required for processing. In addition, after the relationship between the respective pattern segments and the overlapping areas are comprehended, it is further necessary to divide the pattern drawing so as not to produce multiple exposure (overlap), and to develop the respective divided drawings into vector data which are necessary for printing by vector scanning.

If the operations of retrieving the relationship between the respective pattern segments and the overlapping areas over the entire surface of the base, dividing the drawing on the basis of the retrieved data so as not to produce an overlap and developing the respective divided drawings into vector data in order to avoid multiple exposure, as described above, are executed by processings of a computer, the amount of data is so enormous that it takes a long processing time. If it is executed by a hardware processing using an electron circuit, the circuit structure becomes too complicated for practical use.

SUMMARY OF THE INVENTION

Accordingly, it is an object of the present invention to eliminate the above-described problems in the related art and to provide an electron beam direct printing apparatus which is capable of avoiding multiple exposure in printing a pattern faithfully on the basis of the data on electron beam printing pattern in a Gerber format which are outputted from a printing pattern CAD by a simple hardware structure without a complicated software processing such as retrieving the relationship between the respective pattern segments and the overlapping areas and dividing the drawing on the basis of the retrieved data so as not to produce an overlap.

To achieve this aim, an electron beam direct printing apparatus according to the present invention comprises: a direct printing pattern information generating means for setting an electron beam printing pattern on a circuit printing base and outputting it as direct printing pattern information; a deflection scanning data generating means for generating the data necessary for main deflection scanning by an electron beam on the circuit printing base in the direction of the X-axis and in the direction of the Y-axis which is carried out on the basis of the printing pattern information; an electron beam deflection scanning means for executing deflection scanning by the electron beam on the circuit printing base on the basis of the data output from the deflection scanning data generating means; a blanking means provided in the route of radiation of the electron beam for cutting off the electron beam when a control signal is received; a bit map memory for storing a dot graphic which represents the image of the printing pattern irradiated with the beam at the time of the deflection scanning by the electron beam on the circuit printing base by dots which correspond to the points which are to be irradiated with the electron beam; and a radiation control means including a reading means for receiving the data for deflection scanning by the electron beam from the deflection scanning data generating means and reading the dot information at the position in the bit map memory which corresponds to the point which is to be irradiated with the electron beam in accordance with the data, a writing means for judging whether or not the read information includes a dot and writing a dot at the position in the memory if there is no dot, and a blanking control means for permitting radiation if there is no dot, while supplying a control signal to a blanking means so as to cut off the beam and prevent the irradiation of the base if there is a dot.

According to the present invention, since overlap between patterns is detected before scanning and the beam is cut off at the overlapping portions at the time of radiation, it is possible to avoid multiple exposure at real time.

The above and other objects, features and advantages of the present invention will become clear from the following description of the preferred embodiment thereof, taken in conjunction with the accompanying drawings.

DESCRIPTION OF THE PREFERRED EMBODIMENT

An embodiment of an electron beam direct printing apparatus according to the present invention will be explained in detail hereinunder with reference to FIGS. 1 to 5.

Figure 1:
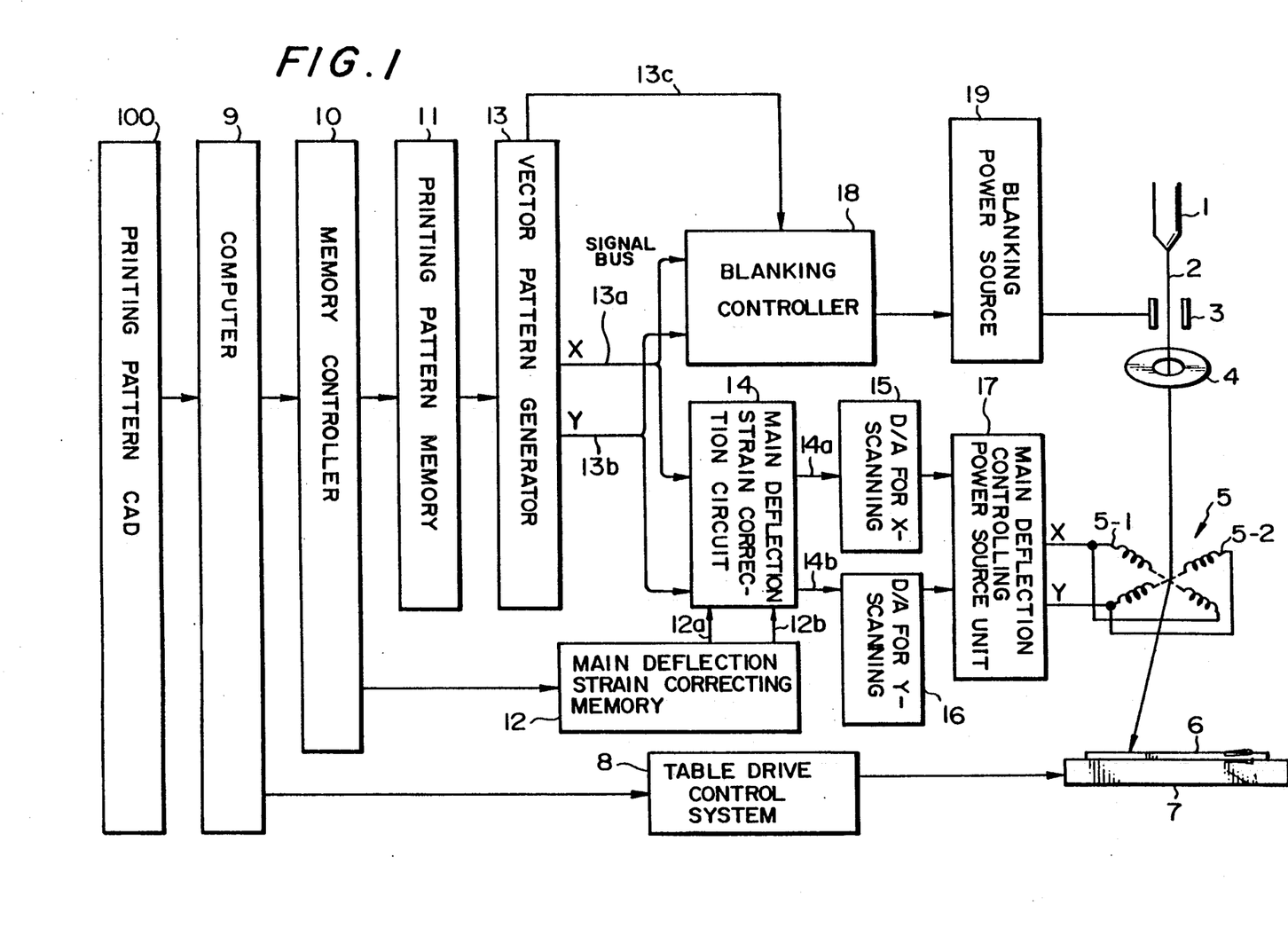
FIG. 1 is a block diagram of the structure of an embodiment of the present invention.

FIG. 1 is a block diagram of the structure of an embodiment of the present invention. In FIG. 1, a cathode 1 emits an electron beam 2 from the tip thereof. A blanker 3 for cutting off the electron beam is provided under the cathode 1 with the electron beam passage sandwiched between the electrodes thereof in the beam passage. An aperture 4 is disposed in the beam passage and sets the spot diameter of the electron beam 2 which passes therethrough.

A main deflector 5 used for the deflection scanning by the electron beam passing through the aperture 4 is composed of a pair of main deflection coils for X-scanning 5-1 and Y-scanning 5-2. A base 6 with a photoresist applied thereto is mounted on an X-Y table 7, which is moved in accordance with the instruction from a table drive control system 8. A printing pattern CAD 100 designs a printing pattern and supplies it to a computer 9 connected to the output side thereof A memory controller 10 is connected to the output side of the computer 9, and a printing pattern memory 11 is connected, in turns, to the output side of the memory controller 10. The memory controller 10 is a control circuit for storing the printing pattern in the printing pattern memory 11.

A main deflection correcting memory 12 is connected to the output side of the memory controller 10 and stores strain correction data for correcting the deflection strain which generally exists in an electronic system. A vector pattern generator 13 receives the pattern data from the printing pattern memory 11 and supplies the data of, for example, 12 bits for X-scanning and Y-scanning of main deflection to signal buses 13a and 13b, respectively. A main deflection strain correction circuit 14 receives the data for X-scanning and Y-scanning of main deflection from the vector pattern generator 13 and the strain correction data from main deflection correcting memory 12 and generates the data for X-scanning and Y-scanning of correction deflection. A D/A converter 15 for X-scanning of main deflection and a D/A converter 16 for Y-scanning of main deflection are connected to the output side of the main deflection strain correction circuit 14 and has a resolution of, for example, 12 bits. A main deflection controlling power source unit 17 is provided between the D/A converter 15 for X-scanning of main deflection and the D/A converter 16 for Y-scanning of main deflection, on one hand and the main deflection coils for X-scanning 5-1 and Y-scanning 5-2, on the other hand. A blanking controller 18 is connected to the output side of the vector pattern generator 13, as shown in detail in FIG. 2. A blanking power source 19 is connected between the blanking controller 18 and the blanker 3.

Figure 2:
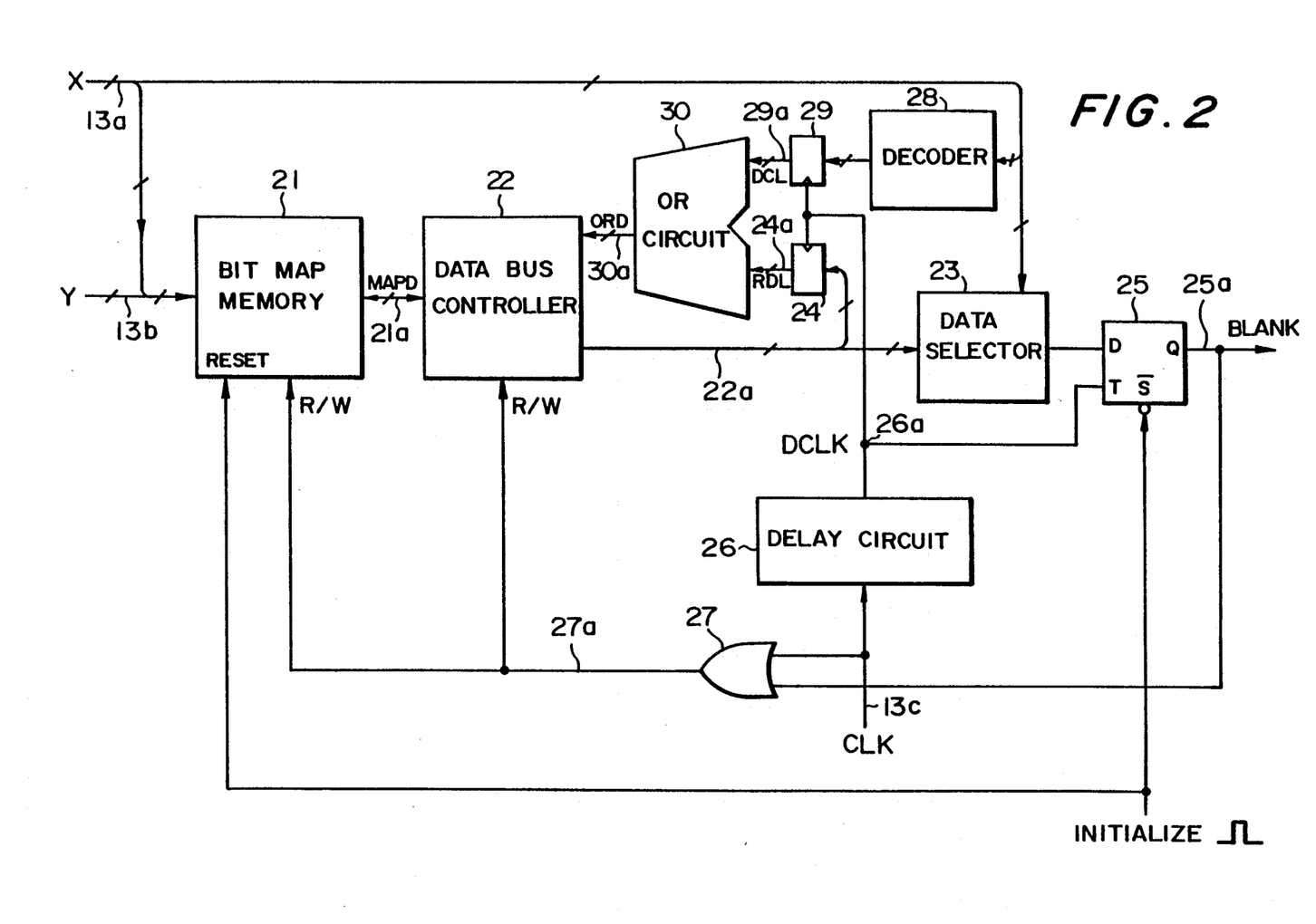
FIG. 2 is a detailed block diagram of the blanking control circuit in the embodiment shown in FIG. 1.

FIG. 2 is a detailed block diagram of the blanking controller 18 shown in FIG. 1, which is the main part of the present invention.

A bit map memory 21 receives the data for X-scanning and Y-scanning of main deflection from the vector pattern generator 13, and stores the dot graphic obtained by resolving the image of the printing pattern, e.g., for one field by the minimum unit (pixel) for the movement of the deflection position of beam radiation and representing the image by dots. The dot graphic is a binary graphic produced by representing the group of dots of the image of the pattern portions which are to be irradiated with the beam by bit [1], thereby indicating "presence of dots" and the group of dots at the other portions which correspond to the base by bit [0], thereby indicating "absence of a dot".

The bit map memory 21 has a structure in which the addresses are assigned with data of 8 bits as one word, as will be described later. In other words, each bit of each word corresponds to the above-described dot.

In the data for X-scanning of main deflection on the signal bus 13a, the first 9 bits are added to the data for Y-scanning of main deflection on the signal bus 13b and these 21 bits are connected to the address bus of the bit map memory 21. In this way, each word (8 bits) in the bit map memory 21 is addressed in accordance with the above-described data of 21 bits.

In the data for X-scanning of main deflection on the signal bus 13a, the last 3 bits are used for assigning the position address of a predetermined 1 bit in the one word (8 bits) of the bit map memory 21 which is addressed by the above-described 21 bits, namely for designating which bit of the 8 bits the predetermined 1 bit is. The data of the last 3 bits is input to the select terminal of a data selector 23 and a decoder 28. The data of the last 3 bits is converted by the decoder 28 into data of 8 bits (e.g., the code shown in FIG. 3(A)) in which only the bit corresponding to the decimal numeral represented by the 3 bits is represented by logic [1] and the other bits are represented by logic [0].

Figure 3A:
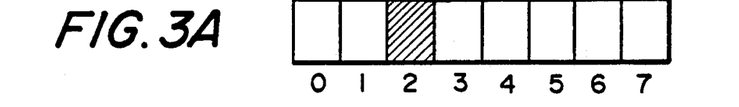
FIG. 3(A) shows the codes output from a data selector.

The code shown in FIG. 3(A) is an example of data of 8 bits converted from the data of 3 bits $[0\ 1\ 0]_2$.

The data outputted from a latch circuit 29 is inputted to an OR operation circuit 30 through a data bus 29a.

Figure 3B:
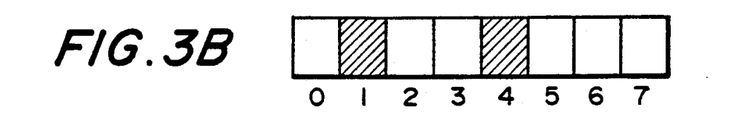
FIG. 3(B) shows the data read out of a bit map memory.

On the other hand, the 8-bit data (dot data such as that shown in FIG. 3(B)) for one word at a predetermined address which is read out of the bit map memory 21 through the data bus controller 22 is supplied to a data selector 23 and a latch circuit 24 through a signal bus 22a. The data outputted from the latch circuit 24 is inputted to the OR operation circuit 30 through a data bus 24a.

Figure 3C:
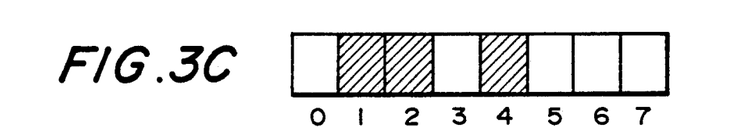
FIG. 3(C) shows the data to be written into the bit map memory.

In this way, the data outputted from the latch circuits 24 and 29 and inputted to the OR operation circuit 30 are subjected to OR operation and outputted as 8-bit data such as that shown in FIG. 3(C). The output data is supplied to a data bus controller 22 through a data bus 30a and written into the bit map memory.

As described above, data of one word at a predetermined address which is outputted from the bit map memory 21 through the data bus controller 22 and the above-described 3-bit data for the position address are inputted to the data selector 23.

The data selector 23 assigns 1 bit in one word on the basis of the position address represented by 3-bit data. The selected and assigned information of 1 bit in the input data of 8 bits is supplied to a flip flop circuit 25 to judge the condition (whether or not there is a dot). In the flip flop circuit 25, the reference clock signal from the vector pattern generator 13 is synchronized with a delayed clock signal which is obtained by delaying the reference clock signal by the time T. And the synchronous signal is outputted as a beam blanking control signal.

The beam blanking control signal is inputted to the blanking power source 19 and also inputted to an OR circuit 27 together with the reference clock signal outputted from the vector pattern generator 13. The signal outputted from the OR circuit 27 is inputted to the write/read control terminal of the bit map memory 21 and the bus control terminal of the data bus controller 22.

The beam blanking control signal on a signal bus 25a becomes High in the case in which the information of 1 bit from the data selector 23 is "presence of dot" (bit [1]) and becomes Low in the case in which the information is "absence of dot" (bit [0]). The blanking power source 19 and the blanker 3, which are the blanking means, have a function of allowing beam radiation on the base when the signal level is Low and cutting off the beam so as to prevent beam radiation when the signal level is High.

Figure 4A:
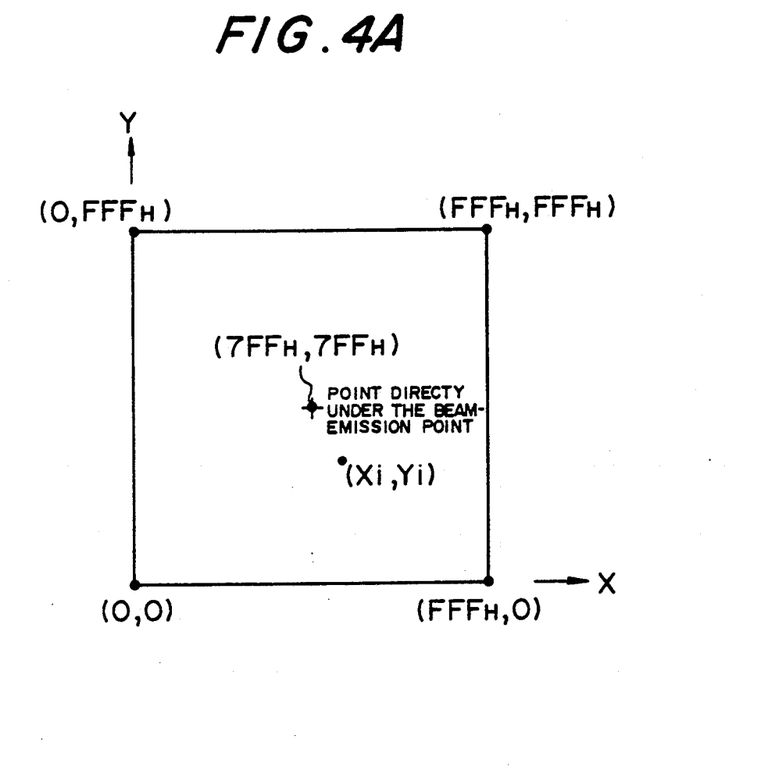
FIGS. 4(A) and 4(B) are explanatory views showing the relationship between the data on the point which is to be irradiated with the electron beam and the beam deflecting region (field)

FIG. 4(A) shows the relationship between the data (X, Y) on the point which is irradiated with the electron beam and the beam deflecting region (field).

Figure 4B:
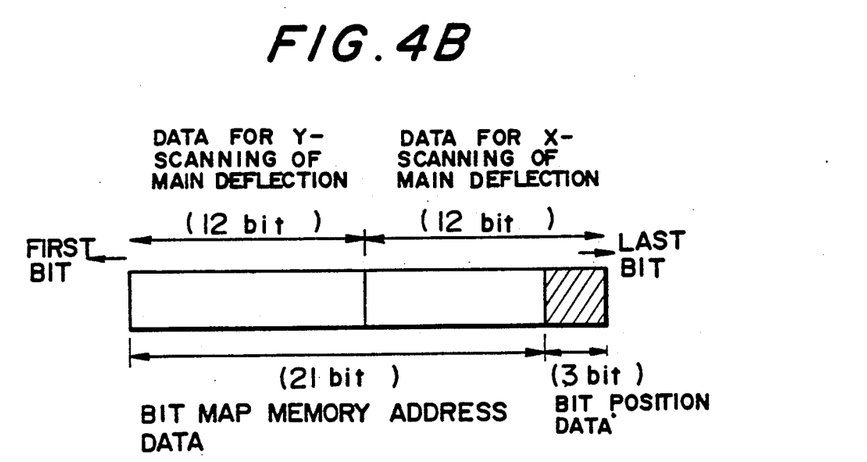

As described above, if the size of both the data on X-scanning position and the data on Y-scanning position at the point which is irradiated with the electron beam is 12 bits, the range of the possible values is $000_H$ to $FFF_H (=2^{12}-1)$ by hexadecimal notation. The point of the data value $(X, Y) = (7FF_H, 7 FF_H)$ in FIG. 4(A) represents the point on the base onto which the electron beam directly radiates without being deflected. If all the deflected positions in the beam deflecting region (field) are developed into the bit map memory 21, since the bit map memory 21 addresses with 8 bit as one word, as described above, the bit map memory 21 is required to have a capacity of $2^{12} 33 2^{12} = 16$ Mbit$=2$ $M_{Byte}$. If it is assumed that the memory structure has 2 Mword$\times$8 bit, a given deflection position $(X_i, Y_i)$ in the beam deflection region indicates the Q-th bit (position address) of a predetermined word (data of 8 bits) at the memory address [512$Y_i$+p] in the bit memory map 21, wherein p is the quotient of $X_i/2^3$ and Q is the remainder. That is, as shown in FIG. 4(B), the data of 21 bits obtained by adding the first 9 bits of the data of 12 bits for X-scanning of main deflection to the data of 12 bits for Y-scanning of main deflection indicates the memory address of a predetermined word which corresponds to the deflection point $(X_i, Y_i)$ in the bit map memory 21.

Figure 5:
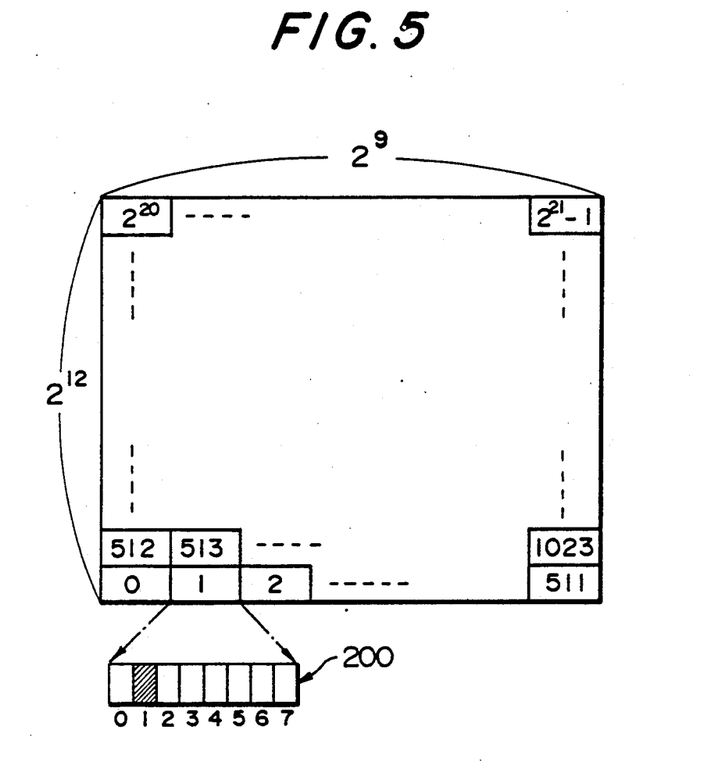
FIG. 5 is an explanatory view of address assignment in the bit map memory.

The memory address of each word in the bit map memory 21 is assigned to one selected from the addressed 0 to $2^{21}$, as shown in FIG. 5. For example, if $Y_i$ is 0 and $X_i$ is 10 at the deflection position, p is 1 and Q is 2, and the bit (represented by the hatched portion) at the position address 1 in the word data at the memory address 1 which is represented by the reference numeral 200 is designated. The remaining 3 bits of the data of 12 bits for X-scanning of main deflection indicates the bit position (position address) of the one word at the memory address corresponding to the deflection point $(X_i, Y_i)$.

Figure 6:
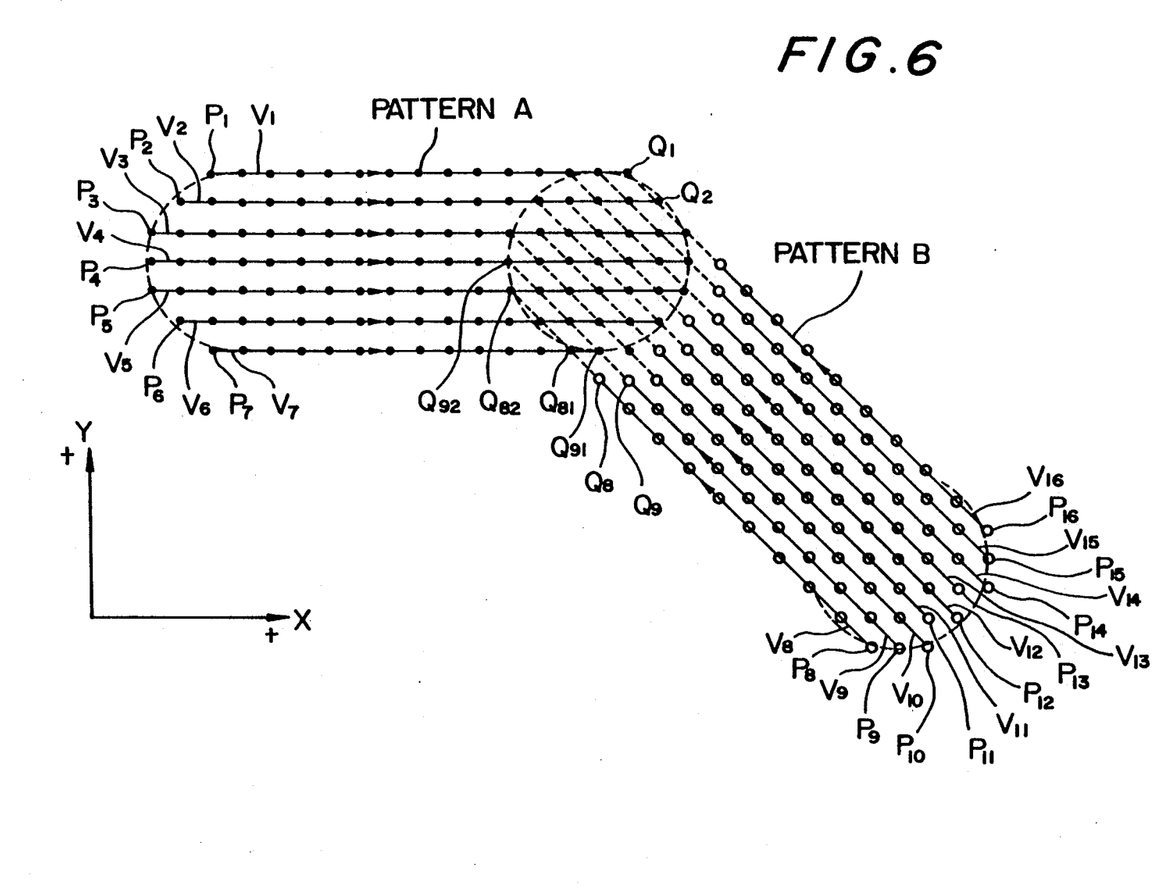
FIG. 6 shows the state in which the connected two patterns are printed by the operation in accordance with the present invention.

FIG. 6 shows the state in which a horizontal pattern A and a pattern B having an inclination of 45° which is connected to the end portion of the horizontal pattern A are printed. It is assumed that the horizontal pattern A is first printed in accordance with the information of the CAD 100, and the oblique pattern B is next printed. The horizontal pattern A is printed by successive vector scanning of 7 vectors $V_1$ to $V_7$ in the direction indicated by the arrows, and the oblique pattern B is similarly printed by successive vector scanning of 9 vectors $V_8$ to $V_{16}$ in the direction indicated by the arrows. The dot represented by a black point (●) or a blank point (0) indicates the point which is to be irradiated with the electron beam in each minimum unit for the movement of the deflection position of beam radiation.

The dots $P_1$ to $P_{16}$ indicate the printing starting points of the respective vectors $V_1$ to $V_{16}$ and the dots $Q_1$ and $Q_2$ indicate the end points of the vectors $V_1$ and $V_2$, respectively, and similarly the right end points of the vectors $V_3$ to $V_7$ represent the respective end points. The dots $Q_{82}$ and $Q_{92}$ indicate the end points of the vectors $V_8$ and $V_9$, respectively, and also the points which the deflected beam of the vectors $V_5$ and $V_4$, respectively, pass. Similarly, the left end points of the fine broken lines of the vectors $V_{10}$ to $V_{16}$ indicate the respective end points.

Figure 7A:
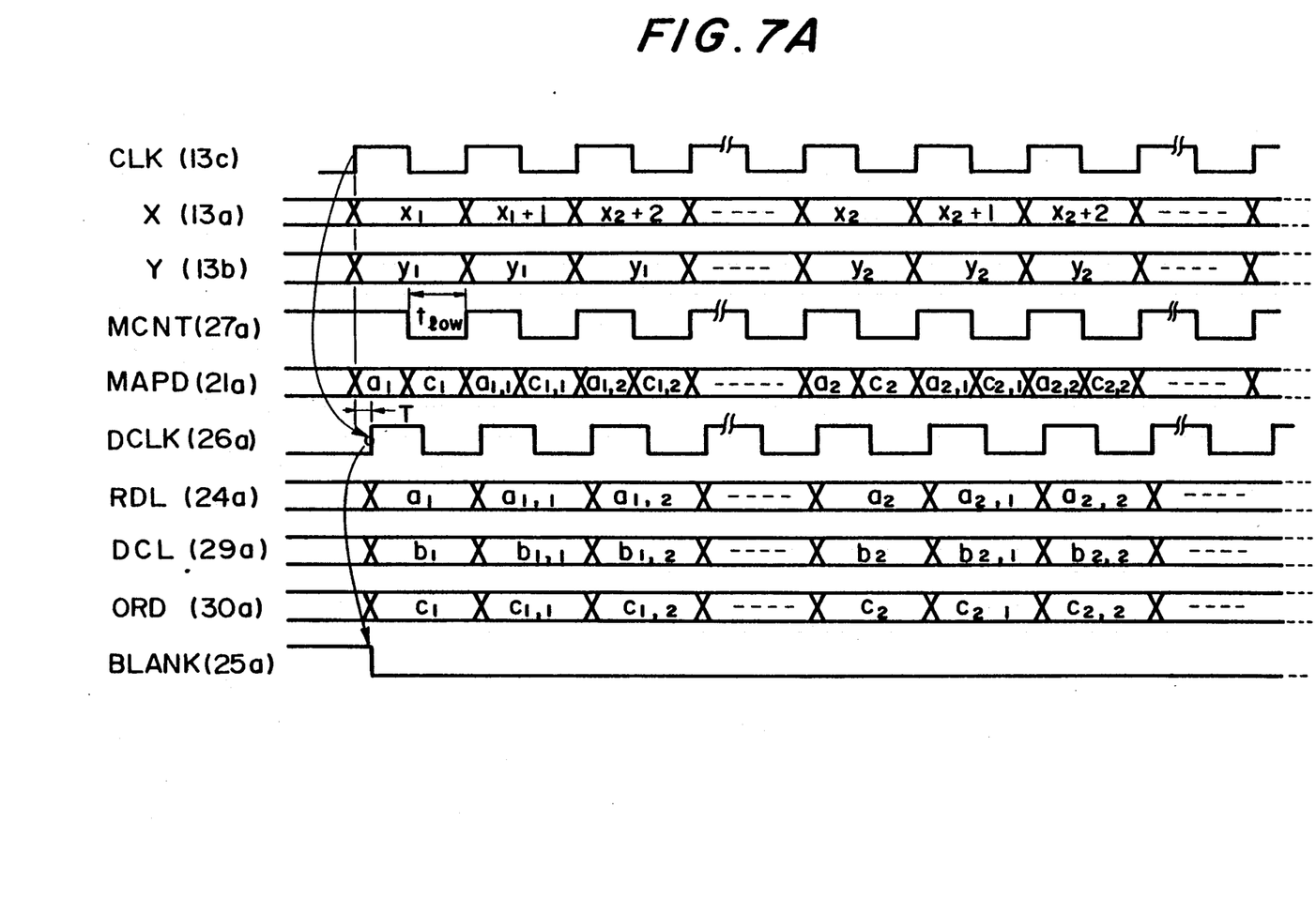
FIGS. 7A and 7B is a signal timing chart explaining the timing for the beam blanking operation in the blanking control circuit.
Figure 7B:
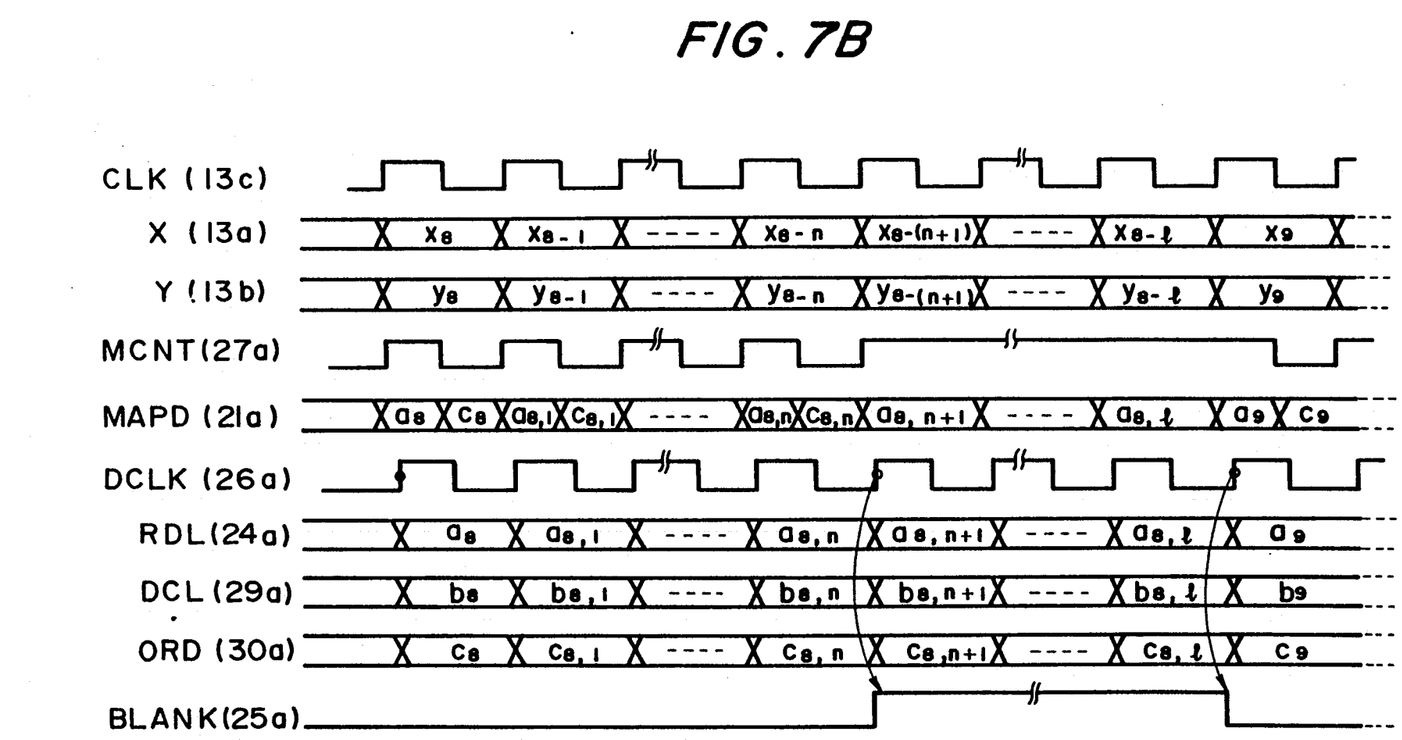

FIGS. 7(A) and 7(B) are signal timing charts which explain the timing for beam blanking operation at the time of printing the patterns A and B shown in FIG. 6.

FIG. 7(A) shows the timing of each signal output while the beam is continuously moved in the direction indicated by the arrows from the dot $P_1$ to the dot $Q_2$ through the dots $Q_1$ and $P_2$ at the time of printing the pattern A.

FIG. 7(B) shows the timing of each signal output while the beam is continuously moved in the upper left direction with an inclination of 45° as indicated by the arrows from the dot $P_8$ to the dot $Q_{82}$ at the time of printing the pattern B after printing the pattern A.

In FIGS. 7(A) and 7(B), to the left ends of the respective signals CLK, X, Y . . . , and BLANK are added the corresponding signal buses 13c, 13a, 13b, . . . 25a shown in FIG. 2.

Among the signals, each of the signals X, Y, MAPD, RDL, DCL and ORD shows the state of transition of 8-bit data.

The deflecting operation and the beam blanking operation of an electron beam direct printing apparatus of the present invention will now be explained.

The output (printing pattern information) of the printing pattern CAD 100 is inputted to the computer 9 by an on-line circuit, or a magnetic tape or the like In the computer 9, the printing pattern information is divided into printing pattern information for each field, edited again and converted into binary data which are suitable for the direct printing apparatus (these data will be referred to as direct printing pattern information hereinunder). In the direct printing pattern information, for example, starting point coordinates $(X_s, Y_s)$, length of segment and direction of segment are represented by binary digital values for each segment.

Prior to the start of printing, the direct printing pattern information and the main deflection strain correction data are transferred to and stored in the printing pattern memory 11 and the main deflection strain correction memory 12, respectively, through the memory controller 10. With the start of printing, three kinds of data, namely, the data on the starting point coordinates $(X_s, Y_s)$, the length of the segment and the direction of the segment for one segment are read out of the printing pattern memory 11 and input to the vector generator 13. The vector generator 13, which is constituted by an electron circuit logic such as a counter, receives the three kinds of data and outputs the X-scanning data on the signal bus 13a and the Y-scanning data on the signal bus 13b which control the X-scanning and Y-scanning, respectively, of the main deflector 5. The X-scanning data on the signal bus 13a and the Y-scanning data on the signal bus 13b are inputted to the main deflection strain correction circuit 14 and the blanking controller 18. The main deflection strain correction circuit 14 corrects the strain of main deflection in real time in accordance with the X-scanning data on the signal bus 13a, the Y-scanning data on the signal bus 13b and the correction data from the main deflection strain correcting memory 12, namely, X-scanning correction data on a signal bus 12a and Y-scanning correction data on a signal bus 12b. The corrected data are inputted to the D/A converter for X-scanning of main deflection 15 and the D/A converter 16 for Y-scanning of main deflection as X-scanning data and Y-scanning data through a signal bus 14a and a signal bus 14b, respectively, and converted into analog signals. These analog signals are supplied to the main deflection control power source unit 17 provided with a built-in power amplifier and the like. The main deflection control power source unit 17 supplies predetermined currents to the two coils disposed orthogonally to each other, namely, the coil for X-scanning of main deflection 5-1 and the coil for Y-scanning of main deflection 5-2, thereby executing main deflection scanning When the main deflection scanning for one segment is finished in this way, the data for the next one segment are read out from the printing pattern memory 11 and the same main deflection scanning is executed. Predetermined deflection scanning is thus successively carried out for the entire pattern in the filed.

The beam blanking controlling operation executed in the blanking controller 18 at the time of printing the patterns A and B shown in FIG. 6 will be explained with reference to FIGS. 2, 7(A) and 7(B).

The bit map memory 21 is cleared to zero by initialization and the flip flop circuit 25 is set before the start of printing. At this time, the blanking control signal outputted from the flip flop circuit 25 is in the High level (logic [1]), whereby the bit map memory 21 is set at the reading state and the data bus controller 22 is switched to the read side through the OR circuit 27.

With the start of printing, at the rise of the reference clock outputted from the vector pattern generator 13, the X-scanning data $X_1$ and Y-scanning data $Y_1$ which correspond to the deflection point $P_1$ in FIG. 6 are outputted to the signal buses 13a and 13b, respectively. The content $a_1$ (8-bit data) at the memory address in the bit map memory 21 which corresponds to the deflection position ($X_1$, $Y_1$) is outputted to a signal bus 21a. Since the bit map memory 21 has already been cleared to zero by initialization, all the bits of the data $a_1$ are [0] at this stage. The data $a_1$ is inputted to the data selector 23 through the data bus controller 22, wherein 1 bit of the data $a_1$ at the memory address corresponding to the deflection position ($X_1$, $Y_1$) is selected on the basis of the data of the last 3 bits (position address data) of the X-scanning data on the signal bus 13a, and the selected bit is inputted to the flip flop circuit 25. Since the signal logic of the 1 bit is [0], the BLANK signal becomes a Low level at the rise of the output signal DCLK of the clock delay circuit 26.

It is necessary to secure the time longer than the sum of the data access time of the bit map memory 21 and the signal delay times of the data bus controller 22 and the data selector 23 as the time T by which the reference clock signal CLK is delayed by the clock delay circuit 26.

The data $a_1$ is outputted to a signal bus 24a when a trigger of the signal DCLK is received from the latch circuit 24. The last 3 bits of the X-scanning data on the signal bus 13a are converted by the decoder 28 to a code b1 which indicates that only 1 bit of the content (8 bits) of the memory address corresponding to the deflection position ($X_1$, $Y_1$) is logic [1] and the other 7 bits are logic [0]. The code b1 is supplied to the signal bus 29a through the latch circuit 29. The logical sum of the signal RDL on the signal bus 24a and the signal DCL on the signal bus 29a is calculated by the OR operation circuit 30 and outputted to a signal bus 30a as data $c_1$.

Since the output MCNT of the OR circuit 27 is the logical sum of the BLANK signal and the reference clock signal CLK, the period during which the signal level is Low is generated, as indicated by the period $t_{low}$ in FIG. 7(A). At this time, the data bus controller 22 selects a data write bus and switches the bit map memory 21 to the reading state, as described above. During the period $t_{low}$, the data $c_1$ on the signal bus 30a is written in the memory. In this way, when the deflection position ($X_1$, $Y_1$) is designated and the dot information of the bit map memory 21 corresponding to this position is [0], the operation of setting the BLANK signal at a LOW level during one clock and writing [1] at the same bit position in the bit map memory as the position from which the data is read is finished.

The beam deflection positions are subsequently changed with the vector scanning by the beam. While the beam passes the deflection points on the pattern, the bit [1] is similarly written at the points in the bit map memory 21 corresponding to the respective deflection points, while keeping the BLANK signal at a low level.

The case in which the beam passes the deflection points on the pattern B will now be described. In the scanning of the vector $V_8$, the beam passes to the dot $P_8$ to the dot $Q_8$ in the same way as on the pattern A. However, when the deflection point moves to the dot $Q_{81}$, since the bit [1] has already been written at this point in the bit map memory 21 on the pattern A as the bit data, the BLANK signal becomes a High level, thereby cutting off the beam which is to be radiated to the base This state is maintained while the deflection point is between the dot $Q_{81}$ and the dot $Q_{82}$. Similarly, in the case of scanning the vector $V_9$, while the beam passes the dot $P_9$ to the dot $Q_9$, the BLANK signal is at a Low level, thereby allowing the beam to radiate the base, but while the deflection point is between the dot $Q_{91}$ and the dot $Q_{92}$, the BLANK signal becomes a High level, thereby cutting off the beam which is to be radiated to the base.

In this way, during beam deflection scanning, since the beam is cut off by beam blanking control to inhibit radiation at the beam deflection point which has already been exposed, even if there is overlap between patterns, the actual beam radiation is not overlapped. Thus, printing is always carried out in right order without producing multiple exposure.

As described above, according to the present invention, in printing by electron beam scanning, overlap between patterns is detected and the beam is so controlled as to be cut off at the overlapping portion before beam radiation. It is therefore possible to avoid multiple exposure in real time. Accordingly, the amount of data processing for avoiding multiple exposure is greatly reduced and, hence, the throughput is enhanced in comparison with the prior art. In addition, highly accurate pattern printing which is faithful to the printing pattern output from the printing pattern CAD and which is free from multiple exposure is achieved.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. An electron beam direct printing apparatus comprising:
   direct printing pattern information generating means for setting an electron beam printing pattern on a circuit printing base and outputting said printing pattern as direct printing pattern information;
   deflection scanning data generating means for generating data necessary for main deflection scanning by an electron beam on said circuit printing beam in a direction of the X-axis and in a direction of the Y-axis which is carried out on a basis of said printing pattern information;
   electron beam deflection scanning means for executing deflection scanning by said electron beam on said circuit printing base on a basis of said data outputted from said deflection scanning data generating means;
   blanking means provided in a route of radiation of said electron beam for cutting off said electron beam when a control signal is received;
   a bit map memory for storing a dot graphic which represents the image of said printing pattern irradiated with said electron beam at the time of said deflection scanning by said electron beam on said circuit printing base by dots which correspond to the points which are to be irradiated with said electron beam; and
   radiation control means including reading means for receiving said data for deflection scanning by said electron beam from said deflection scanning data generating means and reading the dot information at the position in the bit map memory which corresponds to the point which is to be irradiated with said electron beam in accordance with said data, writing means for judging whether or not the read information includes a dot and writing a dot at the position in said memory if there is no dot, and blanking control means for permitting radiation if there is no dot, while supplying a control signal to a blanking means so as to cut off said beam and prevent the irradiation of said base if there is a dot.

2. An electron beam direct printing apparatus according to claim 1, wherein said printing pattern information generating means includes:
   a printing pattern CAD for setting and outputting an electron beam printing pattern in a Gerber format;
   a computer for dividing said printing pattern information received from said printing pattern CAD into printing pattern information for each field and editing and converting said printing pattern information into binary data as direct printing pattern information;
   a printing pattern memory for storing said direct printing pattern information outputted from said computer; and
   a memory controller for controlling the contents of said printing pattern memory.

3. An electron beam direct printing apparatus according to claim 1, wherein said direct printing pattern information represents starting point coordinates ($X_s$, $Y_s$), length of segment and direction of segment for each segment by binary digital values.

4. An electron beam direct printing apparatus according to claim 1, wherein said deflection scanning data generating means includes vector pattern generating means for receiving pattern information from said direct printing pattern information generating means and supplying said information as data of predetermined bits for X-scanning and Y-scanning of deflection.

5. An electron beam direct printing apparatus according to claim 1, wherein said electron beam deflection scanning means includes:
   a main deflector for executing main deflection scanning by said electron beam when a predetermined current is received;
   a main deflection strain correcting memory which is connected to a output side of said direct printing pattern information and stores strain correction data for correcting a deflection strain existing in an electrooptical system with respect to said printing pattern information;
   a main deflection strain correction circuit for correcting the strain of main deflection on the basis of the strain correction data received from said main deflection strain correcting memory and data for X-scanning and Y-scanning of deflection received from said deflection scanning data generating means and generating correction data for X-scanning and Y-scanning;
   a D/A converter for X-scanning and a D/A converter for Y-scanning which are connected to an output side of said main deflection strain correction circuit so as to convert said correction data for X-scanning and Y-scanning to respective analog signals; and
   a deflection control power source unit which is connected to output sides of said D/A converters for X-scanning and Y-scanning so as to output predetermined currents corresponding to said analog signals received from said D/A converters.

6. An electron beam direct printing apparatus according to claim 5, wherein said main deflector, which is a component of said electron beam deflection scanning means, is composed of two coils, namely, a coil for X-scanning of main deflection and a coil for Y-scanning of main deflection which are disposed orthogonally to each other.

7. An electron beam direct printing apparatus according to claim 4, wherein said dot graphic stored in said bit map memory is a graphic obtained by resolving the image of said electron beam printing pattern for one field by the minimum unit for the movement of the deflection position of beam radiation and representing said image by dots.

8. An electron beam direct printing apparatus according to claim 7, wherein said bit map memory assigns a memory address with 8 bits as one word so as to enable said dots to be inputted in correspondence with respective bits in said word.

9. An electron beam direct printing apparatus according to claim 8, wherein said dot graphic stored in said bit map memory is a binary graphic produced by representing the group of dots of the image of the pattern portions which have already been irradiated with said electron beam by bit [1], thereby indicating "presence of dots" and the group of dots at the other portions by bit [0], thereby indicating "absence of a dot".

10. An electron beam direct printing apparatus according to claim 8, wherein each of said data for X-scanning and Y-scanning outputted from said deflection scanning data generating means each is composed of data of 12 bits, and the first 9 bits of 12 bits of said data for X-scanning are added to 12 bits of said data for Y-scanning and are used for assigning the memory address of said word in said bit map memory, while the last 3 bits of said data for X-scanning is sued for assigning the position address of 1 bit of said word.

11. An electron beam direct printing apparatus according to claim 1, wherein said blanking means includes
   a blanker composed of two electrodes opposed to each other with the electron beam passage therebetween; and
   a blanking power source for applying a blanking voltage to said blanker on the basis of a predetermined control signal, thereby greatly deflecting said electron beam so as to cut off said electron beam when said blanking voltage is applied to said blanker.

12. An electron beam direct printing apparatus according to claim 10, wherein said reading means of said radiation control means includes a data bus controller which is connected to said bit map memory so as to control change-over between the data buses for reading and writing information from said bit map memory, thereby reading the information of the word at the memory address designated on the basis of said deflection scanning data from said deflection scanning data generating means through said data bus controller at a predetermined timing.

13. An electron beam direct printing apparatus according to claim 12, wherein said writing means of said radiation control means includes:
   a decoder for converting the last 3 bits of said data for X-scanning into data of 8 bits indicating the point which is to be irradiated with said electron beam, wherein only the bit corresponding to the decimal numeral integer represented by said 3 bits is represented by logic [1]and the other bits are represented by logic [0]; and
   an OR operation circuit for calculating the logical sum of the data outputted from said decoder and the data in said word at a predetermined address which is read out of said bit map memory by said reading means;
   thereby writing the data outputted from said OR operation circuit into said bit map memory through said data bus controller.

14. An electron beam direct printing apparatus according to claim 13, wherein said blanking means includes:
   a data selector for receiving said data in said word at a predetermined address which is read out by said reading means and said data of last 3 bits of said data of X-scanning and selecting and outputting 1-bit information on the point which is to be irradiated with said electron beam from said word on the basis of said position address indicated by the 3-bit data; and
   a logic device for judging whether or not said information output from said data selector includes a dot, namely, whether said information is logic [1]or logic [0], and outputting a control signal to said blanking means if there is a dot, in other words, if said information is logic [1].

* * * * *